United States Patent
Myers et al.

(10) Patent No.: US 9,570,643 B2
(45) Date of Patent: Feb. 14, 2017

(54) SYSTEM AND METHOD FOR ENHANCED CONVECTION COOLING OF TEMPERATURE-DEPENDENT POWER PRODUCING AND POWER CONSUMING ELECTRICAL DEVICES

(71) Applicant: General Electric Company, Schenectady, NY (US)

(72) Inventors: Kevin Sean Myers, Albany, NY (US); Andrew Maxwell Peter, Saratoga Springs, NY (US); Hendrik Pieter Jacobus de Bock, Clifton Park, NY (US); Patrick Hammel Hart, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 629 days.

(21) Appl. No.: 14/064,721

(22) Filed: Oct. 28, 2013

(65) Prior Publication Data
US 2015/0114010 A1  Apr. 30, 2015

(51) Int. Cl.
*H01L 31/052* (2014.01)
*H01L 23/34* (2006.01)
(Continued)

(52) U.S. Cl.
CPC ......... *H01L 31/052* (2013.01); *G05D 23/1919* (2013.01); *H01L 23/34* (2013.01);
(Continued)

(58) Field of Classification Search
None
See application file for complete search history.

(56) References Cited

U.S. PATENT DOCUMENTS 6,115,633 A    9/2000  Lang et al.
6,853,654 B2   2/2005  McDonald et al.
(Continued)

FOREIGN PATENT DOCUMENTS

DE  19983379 B4  8/2011
EP  2336577 A2   6/2011
(Continued)

OTHER PUBLICATIONS

Wang, Y., Yuan, G., Yoon, Y.-K., Allen, M.G. and Bidstrup, S.A.; "Optimization of Synthetic Jet Fluidic Structures in Printed Wiring Boards", Dec. 2006, Journal of Electronic Packaging, vol. 128.*
(Continued)

*Primary Examiner* — Mohammad Ali
*Assistant Examiner* — Kelvin Booker
(74) *Attorney, Agent, or Firm* — Ziolkowski Patent Solutions Group, SC; Jean K. Testa

(57) ABSTRACT

A cooling system for cooling a temperature-dependent power device includes an active cooling device and a controller to generate and transmit a drive signal thereto to selectively activate the device. The controller receives an input from sensors regarding the cooling device power consumption and measured operational parameters of the power equipment—including the power device output power if the device is a power producing device or the power device input power if the device is a power consuming device. The controller generates and transmits a drive signal to the cooling device based on the cooling device power consumption and the measured power device input or output power in order to cause the active cooling device to selectively cool the heat producing power device. A net system power output or total system power input can be maximized/minimized by controlling an amount of convection cooling provided by the cooling device.

20 Claims, 4 Drawing Sheets

(51) Int. Cl.
*H01L 23/433* (2006.01)
*G05D 23/19* (2006.01)
*H02S 40/42* (2014.01)
*H01L 23/467* (2006.01)

(52) U.S. Cl.
CPC ........ *H01L 23/4336* (2013.01); *H01L 23/467* (2013.01); *H02S 40/425* (2014.12); *H01L 2924/0002* (2013.01)

(56) References Cited

U.S. PATENT DOCUMENTS

| | | | |
|---|---|---|---|
| 7,845,709 | B2 | 12/2010 | Browne et al. |
| 7,892,690 | B2 | 2/2011 | Kaye et al. |
| 8,030,886 | B2 | 10/2011 | Mahalingam et al. |
| 8,035,320 | B2 | 10/2011 | Sibert |
| 2005/0216775 | A1 | 9/2005 | Inoue |
| 2009/0050294 | A1* | 2/2009 | Fedorov ............... G06F 1/20 165/80.3 |
| 2009/0323277 | A1 | 12/2009 | Hosokawa |
| 2010/0051242 | A1 | 3/2010 | Arik et al. |
| 2010/0053891 | A1* | 3/2010 | Arik ............... H01L 23/467 361/692 |
| 2010/0054973 | A1* | 3/2010 | Arik ............... F04B 43/095 417/437 |
| 2010/0110630 | A1 | 5/2010 | Arik et al. |
| 2011/0089830 | A1 | 4/2011 | Pickard et al. |
| 2011/0110108 | A1* | 5/2011 | Calon ............... F21V 29/02 362/373 |
| 2011/0114287 | A1* | 5/2011 | Arik ............... H05K 7/20172 165/67 |
| 2011/0139893 | A1* | 6/2011 | Wetzel ............... F15D 1/00 239/102.2 |
| 2011/0147476 | A1* | 6/2011 | Saddoughi ......... B05B 17/0607 239/4 |
| 2011/0162823 | A1* | 7/2011 | Sharma ............... H01L 23/467 165/104.34 |
| 2011/0174462 | A1* | 7/2011 | Arik ............... F28F 3/022 165/96 |
| 2011/0240260 | A1* | 10/2011 | Van Der Tempel .... F21V 29/02 165/80.2 |
| 2012/0073788 | A1* | 3/2012 | Streyle ............... H05K 7/20172 165/104.34 |
| 2012/0170216 | A1 | 7/2012 | Arik et al. |
| 2012/0268936 | A1 | 10/2012 | Pickard et al. |
| 2013/0201316 | A1* | 8/2013 | Binder ............... H04L 67/12 348/77 |
| 2013/0208469 | A1* | 8/2013 | Progl ............... F21V 29/506 362/235 |
| 2014/0049964 | A1* | 2/2014 | McClure ............... F21V 29/2212 362/249.06 |
| 2014/0049970 | A1* | 2/2014 | de Bock ............. H01L 41/0926 362/373 |

FOREIGN PATENT DOCUMENTS

| | | |
|---|---|---|
| EP | 2447992 A2 | 5/2012 |
| JP | 2013080765 A | 5/2013 |
| KR | 20130077855 A | 7/2013 |

OTHER PUBLICATIONS

Ramabhadran, R.; Glaser, J.S. and de Bock, H.P.; "A Low Power Consumption Driver With Low Acoustics for Piezoelectric Synthetic Jets", Sep. 15-19, 2013, 2013 IEEE Energy Conversion Congress and Exposition.*

Mahalingam, R.; "Synthetic Jets for Forced Air Cooling of Electronics", May 2007, Electronics Cooling Magazine.*

Li, S.; "A Numerical Study of Micro Synthetic Jet and Its Applications in Thermal Management", Dec. 2005, PhD Thesis, Georgia Institute of Technology.*

Qats.com, "How to Use Synthetic Jets for Local Thermal Management", Jun. 22, 2011, Retrieved from the Internet on May 12, 2016 at "http://www.qats.com/cms/2011/06/22how-to-use-synthetic-jets-for-local-thermal-management/".*

Dogruoz, M.B. and Arik, M.; "Synthetic Jets for Electronics Cooling Applications", Jul. 16-18, 2012, 9$^{th}$ International Conference on Heat Transfer, Fluid Mechanics and Thermodynamics.*

"GE prototype LED lamp matches 100W PAR38 output," LEDs Magazine, Oct. 26, 2010.

The European Search Report and Opinion issued in connection with the corresponding EP Applications No. 14190542.2 on Jul. 3, 2015.

* cited by examiner

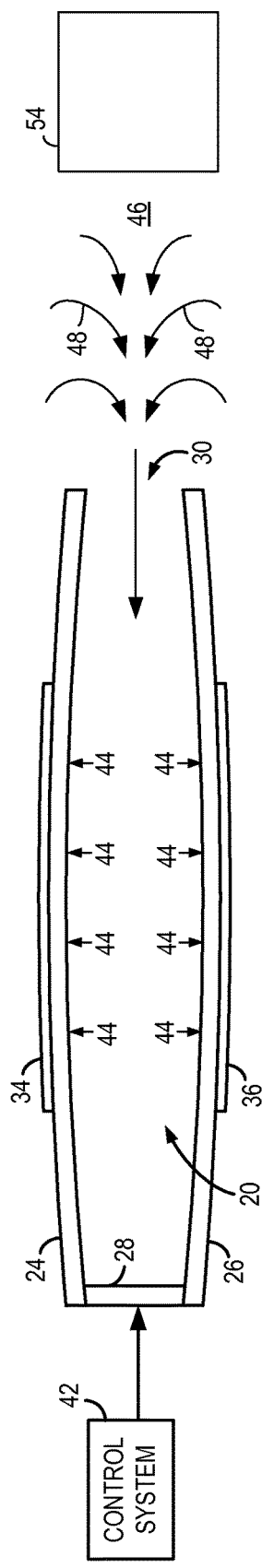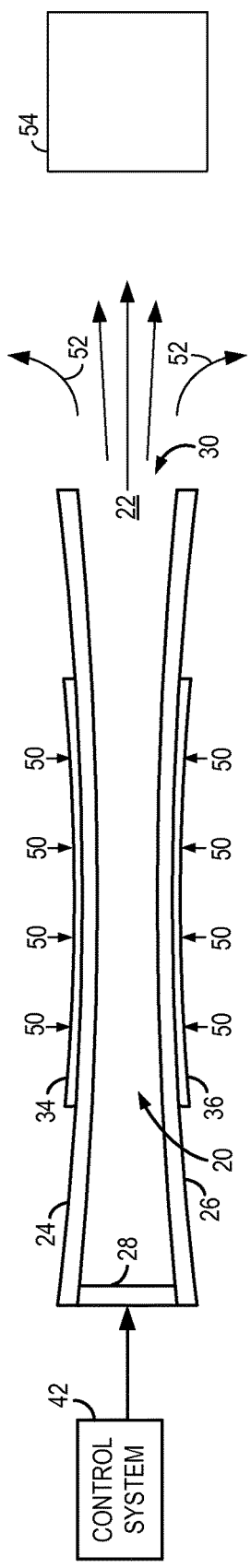

SYSTEM AND METHOD FOR ENHANCED CONVECTION COOLING OF TEMPERATURE-DEPENDENT POWER PRODUCING AND POWER CONSUMING ELECTRICAL DEVICES

BACKGROUND OF THE INVENTION

Embodiments of the invention relate generally to a temperature-dependent power producing and power consuming devices and, more particularly, to a system and method for providing controlled cooling to such devices to maximize a power output or minimize a power consumption by such devices.

It is well known that effective cooling of certain temperature-dependent power producing and power consuming electrical devices is an essential component regarding the operation and performance of such devices, as effective cooling can prolong the lifetime of such devices and can lead to performance efficiency gains for such devices. For example, with respect to the operation of such temperature-dependent electrical devices, proper cooling of the devices can maximize a power output of power producing devices or minimize a power consumption of power consuming devices.

One example of a temperature-dependent power producing device whose performance can be maximized by proper temperature control is a solar photovoltaic (PV) panel. PV panels are semiconductor-based energy conversion devices that convert energy in the form of photons to electricity in the form of electrons. It is known that the performance of a solar PV panel degrades with increased temperature and that the efficiency of a solar PV panel is a linear function of panel temperature—i.e., the amount of solar radiation absorbed by the PV panel that is converted to DC electricity is temperature dependent, with the fraction of radiation converted to DC electricity being the efficiency of the PV panel. The temperature-dependent efficiency of PV panels can be problematic—as typical solar PV panels are on the order of 10-20% efficient at converting the incident solar radiation to electricity, with the remaining energy absorbed by the solar PV panels that is not converted to electricity acting to heat the device. This energy must thus be removed from the PV panels in order to maintain a desired efficiency, as otherwise it would remain in the device resulting in an increase in temperature.

One example of temperature-dependent power consuming devices whose performance can be maximized by proper temperature control is integrated circuits (ICs) or processing devices employed in telecom equipment. In such devices, it is recognized that heat emission and temperature control of the devices is highly correlated to power consumption as well as to the devices' reliability. As one example, it is known that the leakage current in CMOS based FPGAs (which are commonly used in telecommunications equipment) increases with temperature since a positive feedback loop exists between leakage power and temperature.

In addressing the issue of temperature control in temperature-dependent power producing and power consuming devices, cooling systems can be employed for providing cooling to the devices that utilize either passive cooling or active cooling. Prior art cooling systems that utilize passive cooling approaches have previously used a natural convection cooled heat sink attached to the device (e.g., heatsink on the backside of a PV panel). However, while such passive convection cooling may provide some control over the operating temperature of the device, these passive cooling systems are limited with respect to the level of cooling they can provide, thus also inherently placing limits on the performance of the temperature-dependent power producing and/or power consuming device. Prior art cooling systems that utilize active cooling approaches have previously used, for example, mechanisms such as a fan to provide forced air convection or an active liquid cooling device where a liquid such as water or water-based fluid is circulated to remove heat from the electrical device. However, existing active cooling approaches can be high cost, prone to failure (due to rotating parts, bearings, or grease that may fail/wear away), or consume significant amounts of power themselves—such that benefits of the active cooling device is minimized.

Accordingly, there is a need for a simplified system and method for providing cooling to temperature-dependent power producing and power consuming devices, with the system and method providing controlled cooling to maximize a power output or minimize a power consumption by such devices. It would further be desirable for such a system and method to provide such cooling in an efficient matter, with the cooling system consuming small amounts of power and being resistive to failure, so as to provide inexpensive and reliable cooling.

BRIEF DESCRIPTION OF THE INVENTION

In accordance with one aspect of the invention, a cooling system includes a low power active cooling device and a controller electrically coupled to the active cooling device, the controller configured to generate and transmit a drive signal to the active cooling device to selectively activate the active cooling device. The cooling system also includes a plurality of sensors configured to measure power consumption of the active cooling device and to measure one or more operational parameters associated with operation of a heat producing electrical device being cooled by the active cooling device, the heat producing electrical device comprising one of a temperature-dependent power producing device and a temperature-dependent power consuming device. The controller of the cooling system is configured to receive an input from the plurality of sensors of the power consumption of the active cooling device and of the one or more measured operational parameters, the input including a device output power if the heat producing electrical device is a power producing device or a device input power if the heat producing electrical device is a power consuming device. The controller of the cooling system is further configured to generate and transmit a drive signal to the active cooling device based on the received input of the power consumption of the active cooling device and of the measured operational parameters in order to cause the active cooling device to selectively cool the heat producing electrical device. In generating and transmitting the drive signal to the active cooling device, the controller controls an amount of convection cooling provided by the active cooling device in order to maximize a net system power output if the device is a power producing device or minimize a total system power input if the device is a power consuming device, with the maximizing of the net system power output comprising maximizing a net power defined by the power generated by the power producing device minus the power consumed by the active cooling device and with the minimizing of the total system power input comprising minimizing a total power defined by the power consumed by the power consuming device plus the power consumed by the active cooling device.

In accordance with another aspect of the invention, a method of cooling a temperature-dependent power producing device includes providing an active cooling device configured to generate a cooling fluid flow that provides convection cooling for a power producing device, the power producing device comprising a temperature-dependent power producing device where a level of power generated therefrom is dependent in part on an operating temperature of the device. The method also includes operatively connecting a controller to the active cooling device that is configured to control a supply of power provided to the active cooling device in order to selectively provide the convection cooling for the device and providing at least one of a current measurement and a voltage measurement of the output power generated by the power producing device to the controller, the at least one of the current measurement and the voltage measurement of the output power being measured by one or more sensors. The method further includes providing a measurement of power consumed by the active cooling device in cooling the power producing device to the controller and controlling, via the controller, the supply of power provided to the active cooling device based on the measurement of power provided to the active cooling device and based on the at least one of the current measurement and the voltage measurement provided to the controller. In the controlling of the supply of power provided to the active cooling device, the controller controls an amount of convection cooling provided by the active cooling device in order to cause the power producing device to be operated at a temperature at which a net system power is maximized, the net system power being defined as the power generated by the power producing device minus the power consumed by the active cooling device.

In accordance with yet another aspect of the invention, a method of cooling a temperature-dependent power consuming device includes providing a low power active cooling device configured to generate a cooling fluid flow that provides convection cooling for a power consuming device, the power consuming device comprising a temperature-dependent power consuming device where a level of power consumed thereby is dependent in part on an operating temperature of the device. The method also includes operatively connecting a controller to the active cooling device that is configured to control a supply of power provided to the active cooling device in order to control generation of the cooling jet so as to selectively provide the convection cooling for the device and providing to the controller at least one of a current measurement and a voltage measurement of the input power provided to the power consuming device responsive to a power demand thereby, the at least one of the current measurement and the voltage measurement of the input power being measured by one or more sensors. The method further includes providing to the controller a measurement of power consumed by the active cooling device in cooling the power consuming device and controlling, via the controller, the supply of power provided to the active cooling device based on the measurement of power provided to the active cooling device and based on the at least one of the current measurement and the voltage measurement provided to the controller. In the controlling of the supply of power provided to the active cooling device, the controller controls an amount of convection cooling provided by the active cooling device in order to cause the power consuming device to be operated at a temperature at which a total system power is minimized, the total system power being defined as the power consumed by the power consuming device plus the power consumed by the active cooling device.

Various other features and advantages will be made apparent from the following detailed description and the drawings.

BRIEF DESCRIPTION OF THE DRAWINGS

The drawings illustrate embodiments presently contemplated for carrying out the invention.

In the drawings:

FIG. 3 is a cross-section of the synthetic jet of FIG. 2 depicting the jet as the control system causes the diaphragms to travel inward, toward the orifice.

FIG. 4 is a cross-section of the synthetic jet actuator of FIG. 2 depicting the jet as the control system causes the diaphragms to travel outward, away from the orifice.

DETAILED DESCRIPTION OF THE PREFERRED EMBODIMENT

Embodiments of the invention relate to a system and method for enhanced convection cooling of temperature-dependent power producing or power consuming electrical devices. A cooling system that provides enhanced convection cooling is operated via a control scheme that varies the amount of convection cooling provided by the cooling system in order to maximize the net system power output of power producing electrical devices or to minimize the total system power consumption of power consuming electrical devices. The convection cooling provided by the cooling system is selectively controlled via the implemented control scheme during changing operating conditions of the temperature-dependent power producing/power consuming electrical devices.

According to embodiments of the invention, a cooling system for enhanced convection cooling of temperature-dependent power producing or power consuming electrical devices includes low power active cooling device(s) to provide the convection cooling. The low power active cooling device(s) can take a variety of forms, such as fans or blowers for example, but in an exemplary embodiment of the invention the low power active cooling device(s) are in the form of synthetic jet actuators or assemblies that provide the convection cooling. Synthetic jet actuators are a technology that generates a synthetic jet of fluid to influence the flow of that fluid over a surface. A typical synthetic jet actuator comprises a housing defining an internal chamber. An orifice is present in a wall of the housing. The actuator further includes a mechanism in or about the housing for periodically changing the volume within the internal chamber so that a flow is generated and projected in an external environment out from the orifice of the housing. This flow can include fluid vortices. Examples of volume changing mechanisms may include, for example, a piston positioned in the jet housing to move fluid in and out of the orifice during reciprocation of the piston or a flexible diaphragm as a wall of the housing. The flexible diaphragm is typically actuated by a piezoelectric actuator or other appropriate means.

Figure 1:
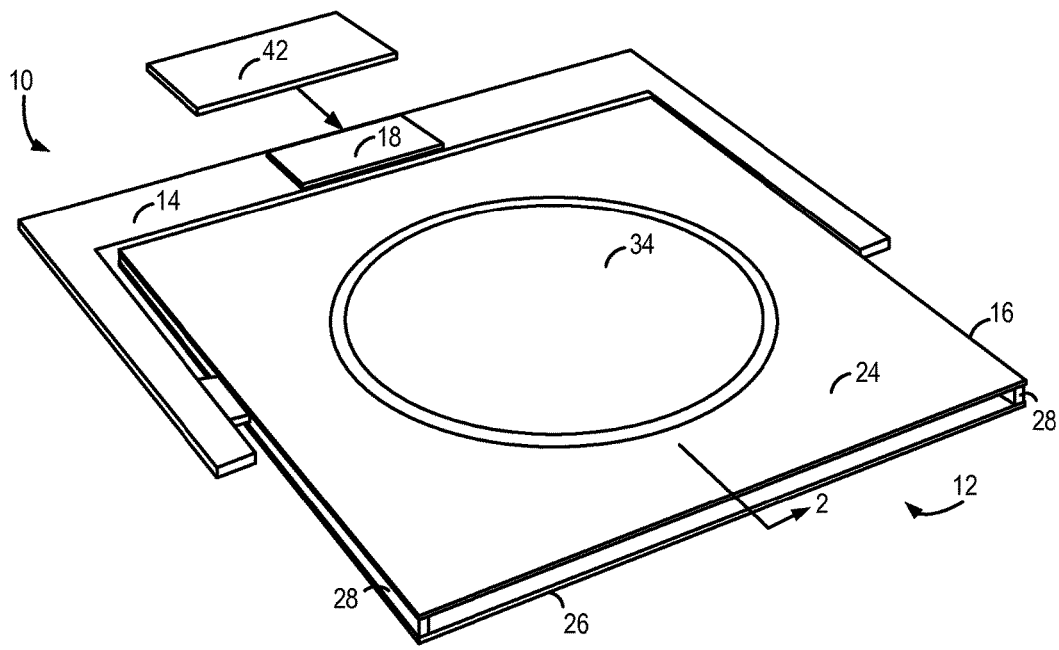
FIG. 1 is a perspective view of a synthetic jet assembly for use with embodiments of the invention.
Figure 2:
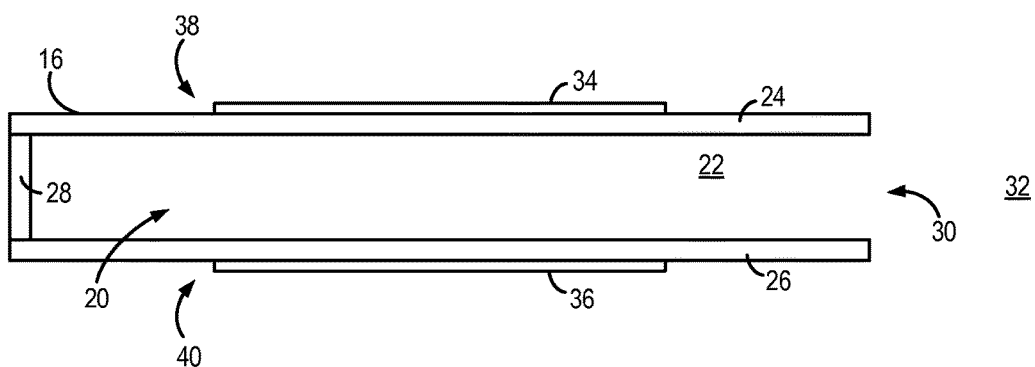
FIG. 2 is a cross-section of a portion of the synthetic jet of FIG. 1.

An exemplary embodiment of a synthetic jet assembly 10 useable with embodiments of the invention is illustrated in FIG. 1, with the particular synthetic jet assembly 10 shown therein being constructed as a dual cool jet (DCJ) that includes two piezoelectric actuators (or other suitable actuators) that cause deflection of opposing flexible diaphragm walls of the housing in order to change the volume within the internal chamber of the housing so as to generate and project a flow out from the orifice of the housing. As shown in FIG. 1, the synthetic jet assembly 10 includes a synthetic jet 12, a cross-section of which is illustrated in FIG. 2, and a mounting device 14. In one embodiment, mounting device 14 is a u-shaped bracket that is affixed to a housing or body 16 of synthetic jet 12 at one or more locations. A circuit driver 18 can be externally located or affixed to mounting device 14. Alternatively, circuit driver 18 may be remotely located from synthetic jet assembly 10.

Referring now to FIGS. 1 and 2 together, housing 16 of synthetic jet 12 defines and partially encloses an internal chamber or cavity 20 having a gas or fluid 22 therein. While housing 16 and internal chamber 20 can take virtually any geometric configuration according to various embodiments of the invention, for purposes of discussion and understanding, housing 16 is shown in cross-section in FIG. 2 as including a first plate 24 and a second plate 26, which are maintained in a spaced apart relationship by a spacer element 28 positioned therebetween. In one embodiment, spacer element 28 maintains a separation of approximately 1 mm between first and second plates 24, 26. One or more orifices 30 are formed between first and second plates 24, 26 and the side walls of spacer element 28 in order to place the internal chamber 20 in fluid communication with a surrounding, exterior environment 32. In an alternative embodiment, spacer element 28 includes a front surface (not shown) in which one or more orifices 30 are formed.

According to various embodiments, first and second plates 24, 26 may be formed from a metal, plastic, glass, and/or ceramic. Likewise, spacer element 28 may be formed from a metal, plastic, glass, and/or ceramic. Suitable metals include materials such as nickel, aluminum, copper, and molybdenum, or alloys such as stainless steel, brass, bronze, and the like. Suitable polymers and plastics include thermoplastics such as polyolefins, polycarbonate, thermosets, epoxies, urethanes, acrylics, silicones, polyimides, and photoresist-capable materials, and other resilient plastics. Suitable ceramics include, for example, titanates (such as lanthanum titanate, bismuth titanate, and lead zirconate titanate) and molybdates. Furthermore, various other components of synthetic jet 12 may be formed from metal as well.

Actuators 34, 36 are coupled to respective first and second plates, 24, 26 to form first and second composite structures or flexible diaphragms 38, 40, which are controlled by driver 18 via a controller or control unit 42. As shown in FIG. 1, in one embodiment controller 42 is electronically coupled to driver 18, which is coupled directly to mounting bracket 14 of synthetic jet 12. In an alternative embodiment controller 42 is integrated into a driver 18 that is remotely located from synthetic jet 12. For example, each flexible diaphragm 38, 40 may be equipped with a metal layer and a metal electrode may be disposed adjacent to the metal layer so that diaphragms 38, 40 may be moved via an electrical bias imposed between the electrode and the metal layer. Moreover, controller 42 may be configured to generate the electrical bias by any suitable device, such as, for example, a computer, logic processor, or signal generator.

In one embodiment, actuators 34, 36 are piezoelectric motive (piezomotive) devices that may be actuated by application of a harmonic alternating voltage that causes the piezomotive devices to rapidly expand and contract. During operation, controller 42 (in conjunction with driver 18) generates a drive signal that causes an electric charge to be transmitted to piezoelectric actuators 34, 36, which undergo mechanical stress and/or strain responsive to the charge. The stress/strain of piezomotive actuators 34, 36 causes deflection of respective first and second plates 24, 26 such that a time-harmonic or periodic motion is achieved. The resulting volume change in internal chamber 20 causes an interchange of gas or other fluid between internal chamber 20 and exterior volume 32, as described in detail with respect to FIGS. 3 and 4.

Piezomotive actuators 34, 36 may be monomorph or bimorph devices, according to various embodiments of the invention. In a monomorph embodiment, piezomotive actuators 34, 36 may be coupled to plates 24, 26 formed from materials including metal, plastic, glass, or ceramic. In a bimorph embodiment, one or both piezomotive actuators 34, 36 may be bimorph actuators coupled to plates 24, 26 formed from piezoelectric materials. In an alternate embodiment, the bimorph may include single actuators 34, 36, and plates 24, 26 are the second actuators.

The components of synthetic jet 12 may be adhered together or otherwise attached to one another using adhesives, solders, and the like. In one embodiment, a thermoset adhesive or an electrically conductive adhesive is employed to bond actuators 34, 36 to first and second plates, 24, 26 to form first and second composite structures 38, 40. In the case of an electrically conductive adhesive, an adhesive may be filled with an electrically conductive filler such as silver, gold, and the like, in order to attach lead wires (not shown) to synthetic jet 12. Suitable adhesives may have a hardness in the range of Shore A hardness of 100 or less and may include as examples silicones, polyurethanes, thermoplastic rubbers, and the like, such that an operating temperature of 120 degrees or greater may be achieved.

In an embodiment of the invention, actuators 34, 36 may include devices other than piezoelectric motive devices, such as hydraulic, pneumatic, magnetic, electrostatic, and ultrasonic materials. Thus, in such embodiments, control system 42 is configured to activate respective actuators 34, 36 in corresponding fashion. For example, if electrostatic materials are used, control system 42 may be configured to provide a rapidly alternating electrostatic voltage to actuators 34, 36 in order to activate and flex respective first and second plates 24, 26.

The operation of synthetic jet 12 is described with reference to FIGS. 3 and 4. Referring first to FIG. 3, synthetic jet 12 is illustrated as actuators 34, 36 are controlled to cause first and second plates 24, 26 to move outward with respect to internal chamber 20, as depicted by arrows 44. As first and second plates 24, 26 flex outward, the internal volume of internal chamber 20 increases, and ambient fluid or gas 46 rushes into internal chamber 20 as depicted by the set of arrows 48. Actuators 34, 36 are controlled by controller 42 so that when first and second plates 24, 26 move outward from internal chamber 20, vortices are already removed from edges of orifice 30 and thus are not affected by the ambient fluid 46 being drawn into internal chamber 20. Meanwhile, a jet of ambient fluid 46 is synthesized by vortices creating strong entrainment of ambient fluid 46 drawn from large distances away from orifice 30.

FIG. 4 depicts synthetic jet 12 as actuators 34, 36 are controlled to cause first and second plates 24, 26 to flex inward into internal chamber 20, as depicted by arrows 50. The internal volume of internal chamber 20 decreases, and fluid 22 is ejected as a cooling jet through orifice 30 in the direction indicated by the set of arrows 52 toward a device 54 to be cooled—with the device 54 to be cooled being a temperature-dependent power producing device or a temperature-dependent power consuming device, for example. As the fluid 22 exits internal chamber 20 through orifice 30, the flow separates at the sharp edges of orifice 30 and creates vortex sheets which roll into vortices and begin to move away from edges of orifice 30.

While the synthetic jet of FIGS. 1-4 is shown and described as having a single orifice therein, it is also envisioned that embodiments of the invention may include multiple orifice synthetic jet actuators. Additionally, while the synthetic jet actuators of FIGS. 1-4 are shown and described as having an actuator element included on each of first and second plates, it is also envisioned that embodiments of the invention may include only a single actuator element positioned on one of the plates. Furthermore, it is also envisioned that the synthetic jet plates may be provided in a circular, rectangular, or alternatively shaped configuration, rather than in a square configuration as illustrated herein.

Figure 5:
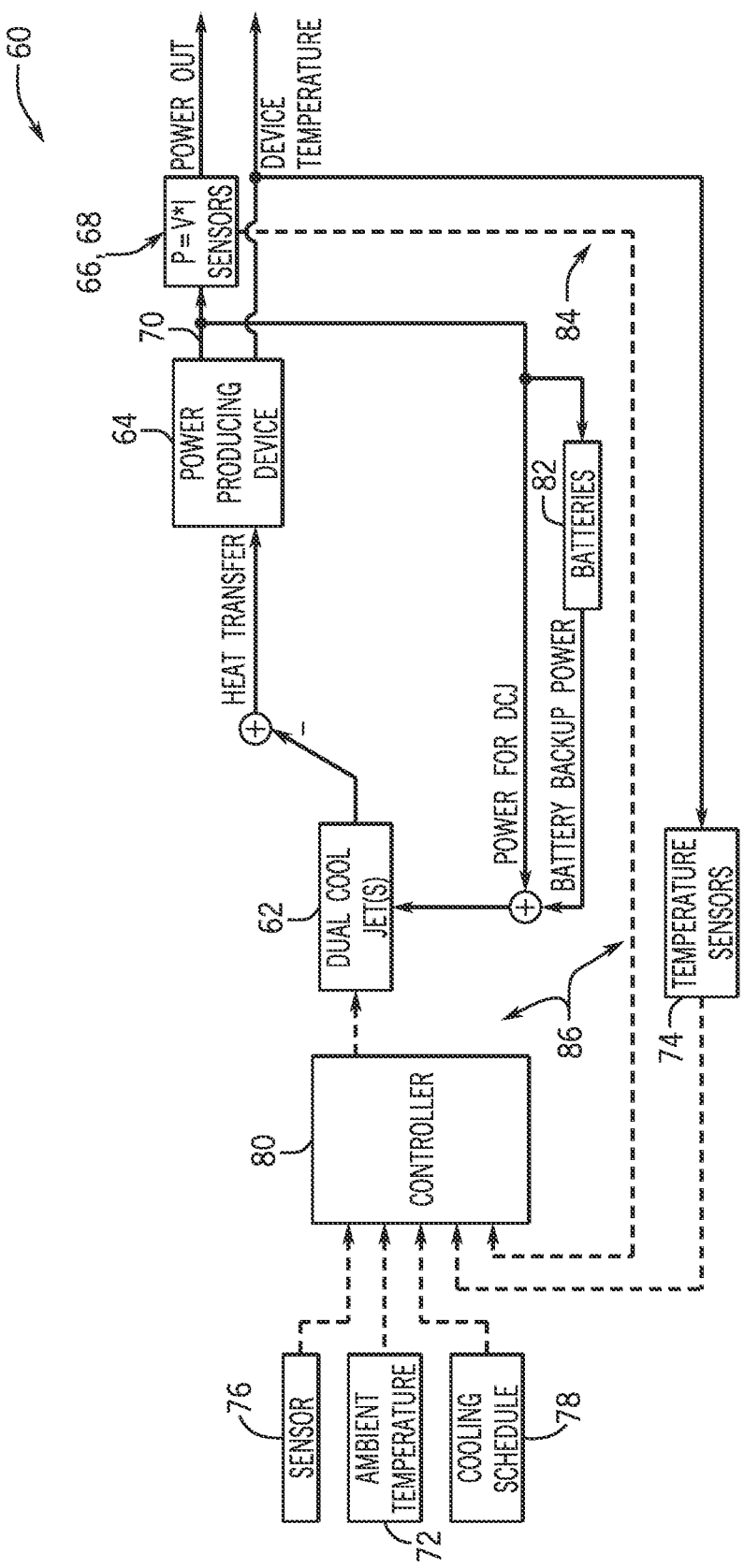
FIG. 5 is a schematic diagram of a control scheme for controlling operation of one or more synthetic jets for providing cooling to a temperature-dependent power producing electrical device according to an embodiment of the invention.
Figure 6:
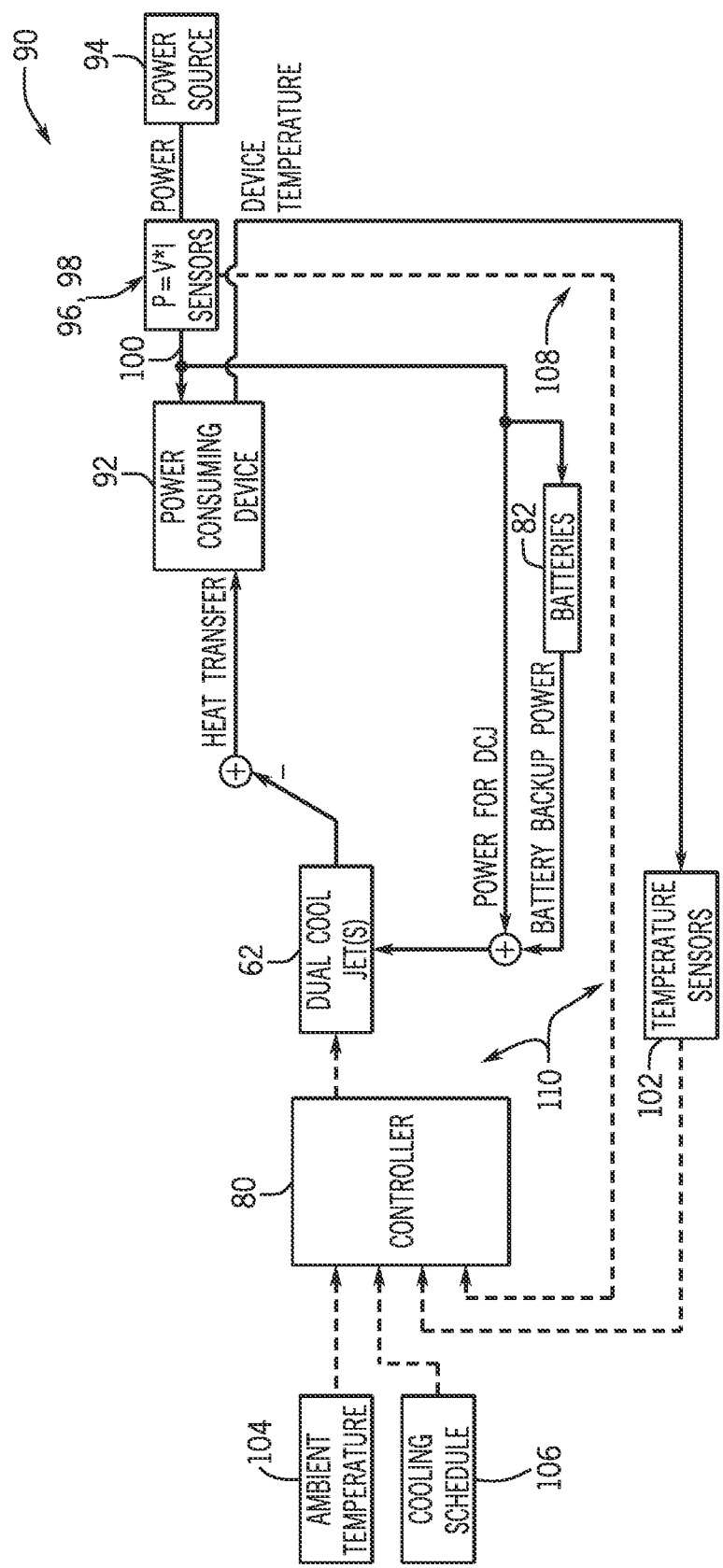
FIG. 6 is a schematic diagram of a control scheme for controlling operation of one or more synthetic jets for providing cooling to a temperature-dependent power consuming electrical device according to an embodiment of the invention.

Referring now to FIGS. 5 and 6, schematic diagrams of control schemes for controlling operation of one or more low power active cooling device(s) for providing cooling to heat producing electrical devices—including a temperature-dependent power producing device (FIG. 5) and a temperature-dependent power consuming device (FIG. 6)—are shown according to embodiments of the invention. According to embodiments of the invention, the control schemes can be implemented to control convection cooling provided by any of a number of active cooling device(s), such as fans or blowers for example, but in an exemplary embodiment of the invention the control schemes control operation of synthetic jets (such as synthetic jets 12 shown in FIGS. 1 to 4). The implementation of the synthetic jets—and the control thereof via specified control schemes—enables improved performance of the electrical devices, by either maximizing a power output of the temperature-dependent power producing device or minimizing power consumed by the temperature-dependent power consuming device. The synthetic jets are mechanically robust and can be operated with minimal power requirements to provide enhanced cooling and effective thermal management for the electrical devices.

Referring first to FIG. 5, a control scheme 60 for operation of one or more synthetic jets 62 for providing cooling to a temperature-dependent power producing device 64 is shown. The temperature-dependent power producing device 64 may take the form of any of a number of types of devices—including (but not limited to) photovoltaic (PV) panels or modules, batteries, power inverters, or other power electronics, for example.

As shown in FIG. 5, a synthetic jet is 62 provided for cooling power producing device 64, with the synthetic jet 62 being mounted on or positioned adjacent to the power producing device 64 such that fluid vortices ejected from the synthetic jet 62 flow onto/across the power producing device 64 in order to provide convection cooling thereto. While only a single synthetic jet 62 is shown, it is recognized that multiple synthetic jets could be provided for cooling the power producing device 64. According to an exemplary embodiment of the invention, the synthetic jet 62 is constructed like the synthetic jet 12 shown in FIGS. 1-4, i.e., as a DCJ, and includes two piezoelectric actuators (or other suitable actuators) that cause deflection of opposing flexible diaphragm walls of the housing in order to change the volume within the internal chamber of the housing so as to generate and project a flow out from the orifice of the housing. It is recognized, however, that the synthetic jet(s) 62 provided for cooling power producing device 64 may be of a different construction, such as having only a single piezoelectric actuator that causes deflection of one wall of the jet housing, for example.

One or more sensors are operably connected to the power producing device 64 that are provided for measuring/monitoring operational parameters associated with operation of the device. At minimum, an output power of the power producing device 64 is measured/monitored by current and/or voltage sensors 66, 68 connected to the output 70 of the device 64. As one example, a DC current output from power producing device 64 can be made using either a shunt resistor or DC current sensor using magnetic fields. According to an exemplary embodiment of the invention, the voltage and current measurements are recorded after power is diverted to the synthetic jet 62, so as to measure the "net system power output" from the device 64, which is defined as the DC power generated by the device 64 minus the power consumed by the synthetic jet 62.

Other operational parameters within which the power producing device 64 is operating and/or that might affect operation of the device can also be measured by appropriate sensors, which are generally indicated at 72, 74, 76, and/or provided as an input parameter. These operational parameters will vary based on the type of power producing device 64 being cooled by the synthetic jet 62 and the types of parameters/data that are available, but can include (for example) more generalized parameters associated with operation of any temperature-dependent power producing device 64—such as ambient temperature within which the device is operating (acquired by temperature sensor 72) and the device operating temperature (acquired by temperature sensor 74)—and/or more specialized parameters that are associated with a specific device operation (e.g., operation of a photovoltaic (PV) module), such as solar irradiance or wind speed (as could be acquired by a general "sensor" indicated by 76). Additionally, a cooling schedule based on historical data could be provided as an input, as indicated at 78.

As further shown in FIG. 5, a controller 80 is operably connected to the synthetic jet(s) 62 to control operation thereof. The controller 80 may have any of a number of architectures, including: a single-input, single-output (SISO) controller; a proportional-integral-derivative (PID) controller; or a multi-input, single-output (MISO) controller, for example. The exact architecture of the controller 80 can be determined, at least in part, based on the number of measurable parameters available for input to the controller 80 from associated sensors, such as sensors 66, 68, 72, 74, 76. Regardless of the specific architecture, the controller 80 functions to control the power supplied to the synthetic jet 62 (i.e., controls generation/transmission of a drive signal to synthetic jet 62) in order to vary the amount/magnitude of the fluid vortices ejected from the jet 62 and/or the frequency with which the fluid vortices are expelled from the jet 62. It is recognized that a single controller 80 could be employed to control operation of the synthetic jet(s) 62 or that multiple controllers could be employed to control operation of multiple synthetic jets 62. According to one embodiment of the invention, the controller 80 and the synthetic jet(s) 62 can be powered by a fraction of power output by the power producing device 64. Alternatively, or as a back-up source of power, a battery 82 may be provided to provide power to the controller 80 and the synthetic jet(s) 62.

In operation, the controller 80 implements control scheme 60 to control the amount of cooling provided by the synthetic jet 62 for the temperature-dependent power producing device 64 so as to maximize a net system power output of the temperature-dependent power producing device 64, with the controller 80 receiving inputs from associated sensors 66, 68, 72, 74, 76 in order to formulate the control scheme 60. At a minimum, the controller 80 operates to receive a measurement of the output power from the power producing device 64 (minus any power provided to the synthetic jet 62/controller 80), as measured by current and/or voltage sensors 66, 68, and a measurement of the power consumed by the synthetic jet 62 in generating a cooling flow. Measurements of other available operational parameters within which the power producing device 64 is operating and/or that might affect operation of the device are also taken by/input to the controller 80, such as the ambient temperature and the device operating temperature acquired by sensors 72, 74, as shown in FIG. 5.

During operation of the power producing device 64, input measurements are fed into the controller 80 to determine the appropriate power level at which to operate the synthetic jet 62 in order to maximize the power output from the power producing device 64. More specifically, the controller 80 determines the appropriate power level at which to operate the synthetic jet 62 in order to maximize the net system power output (i.e., the power generated by the power producing device 64 minus the power consumed by the synthetic jet 62). Controller 80 generates drive signals to operate the synthetic jet 62 based on the received inputs, with the synthetic jet(s) 62 then being operated at a determined power level responsive to the generated drive signal in order to provide cooling to the power producing device 64. The controller 80 has a feedback loop—generally indicated at 84—such that it can monitor the real-time net system power output 70 from the power producing device 64, with the power supplied to the synthetic jet 62 being adjusted/controlled based on the operating conditions and the net power output 70 and in order to maximize the net power output of the power producing device 64. Thus, for example, as the output power 70 from the power producing device 64 begins to degrade with increased operating temperature, the reduction in power is measured/monitored and input to the controller 80, which functions to increase the power supplied to the synthetic jet 62 (via a modified drive signal) in order to lower the operation temperature and accordingly maximize net power output of the power producing device 64.

Collectively, the synthetic jet 62, controller 80 and array of sensors 66, 68, 72, 74, 76 form a cooling system 86 that is provided for cooling the temperature-dependent power producing device 64 in order to maximize a net power output thereof. The cooling system 86 acquires data related to operation of the temperature-dependent power producing device 64 via the sensors 66, 68, 72, 74, 76, provides/inputs the data to the controller 80 (along with other possible non-sensor related inputs), and controls operation of the synthetic jet(s) 62 to provide controlled convection cooling to the device 64 to maximize the power generated thereby.

Referring now to FIG. 6, a control scheme 90 for operation of one or more synthetic jets 62 for providing cooling to a temperature-dependent power consuming device 92 is shown. The temperature-dependent power consuming device 92 may take the form of any of a number of types of devices—including (but not limited to) semiconductor devices, integrated circuits, central processing units (CPUs), graphics processing units (GPUs), LEDs, or telecom devices, for example.

As shown in FIG. 6, a synthetic jet 62 is provided for cooling a power consuming device 92, with the synthetic jet 62 being mounted on or positioned adjacent to the power consuming device 92 such that fluid vortices ejected from the synthetic jet 62 flow onto/across the power consuming device 92 in order to provide convection cooling thereto. While only a single synthetic jet 62 is shown, it is recognized that multiple synthetic jets could be provided for cooling the power consuming device 92. According to an exemplary embodiment of the invention, the synthetic jet 62 is constructed like the synthetic jet 12 shown in FIGS. 1-4, i.e., as a DCJ, and includes two piezoelectric actuators (or other suitable actuators) that cause deflection of opposing flexible diaphragm walls of the housing in order to change the volume within the internal chamber of the housing so as to generate and project a flow out from the orifice of the housing. It is recognized, however, that the synthetic jet(s) 62 provided for cooling power consuming device 92 may be of a different construction, such as having only a single piezoelectric actuator that causes deflection of one wall of the jet housing, for example.

One or more sensors are operably connected to the power consuming device 92 that are provided for measuring/monitoring operation of the device 92. At minimum, the power provided to the power consuming device 92 (e.g., from a power source 94) in order to meet a power demand of the device 92 plus the power provided to the synthetic jet 62 for providing cooling is measured/monitored by current and/or voltage sensors 96, 98 connected to the power input 100 of the device 92. Other operational parameters within which the power consuming device 92 is operating and/or that might affect operation of the device can also be measured by appropriate sensors and/or provided as inputs, which are generally indicated at 102, 104, 106. These operational parameters will vary based on the type of power consuming device 92 being cooled by the synthetic jet 62 and the types of parameters/data that are available, but can include (for example) the ambient temperature (acquired by sensor 104) within which the device is operating, the device operating temperature (acquired by sensor 102), or a cooling schedule based on historical data (provided as an input 106).

As further shown in FIG. 6, a controller 80 is operably connected to the synthetic jet(s) 62 to control operation thereof. The controller 80 functions to control the power supplied to the jet 62 (via generation/transmission of a drive signal) in order to vary the amount/magnitude of the fluid vortices ejected from the jet 62 and/or the frequency with which the fluid vortices are expelled from the jet 62. By controlling the amount of convection cooling provided by the synthetic jet 62 for the temperature-dependent power consuming device 92, the temperature at which the power consuming device 92 operates is selectively controlled so as to minimize power consumed by the temperature-dependent power consuming device 92. The controller 80 receives one or more inputs from associated sensors 96, 98, 102, 104 (and other potential inputs, e.g., 106) in order to formulate the control scheme 90. At a minimum, the controller 80 operates to take a measurement of the total power consumed by the device—i.e., the "total input power," which is defined as the DC power consumed by the device 92 plus the power consumed by the synthetic jet 62. Measurements of other available operational parameters within which the power consuming device 92 is operating and/or that might affect operation of the device 92 are also taken by/input to the controller 80, such as the ambient temperature 104 and the device operating temperature 102 as shown in FIG. 6.

During operation of the power consuming device 92, input measurements of operational parameters are fed into the controller 80 to determine the appropriate power level at which to operate the synthetic jet(s) 62 in order to minimize the total system power (i.e., the power consumed by the power consuming device 92 plus the power consumed by synthetic jet 62), with the synthetic jet(s) 62 then being operated at the determined power level in order to provide cooling to the power consuming device 92. The controller 80 has a feedback loop—generally indicated at 108—such that it can monitor the real-time power provided to the power consuming device 92 and synthetic jet(s) 62 in order to meet a power demand thereof, with the power supplied to the synthetic jet 62 being adjusted/controlled based on the operating conditions and the power consumed and in order to minimize the power consumed by the power consuming device 92. Thus, for example, as the power consumed by the power consuming device 92 begins to increase with increased operating temperature, the increase in power consumed is measured/monitored and input to the controller 80, which functions to increase the power supplied to the synthetic jet 62 in order to lower the operation temperature in order to minimize power consumption and maximize efficiency of the power consuming device 92.

Collectively, the synthetic jet 62, controller 80 and array of sensors 96, 98, 102, 104 form a cooling system 110 that is provided for cooling the temperature-dependent power consuming device 92 in order to minimize a total power consumption thereby. The cooling system 110 acquires data related to operation of the temperature-dependent power consuming device 92 via the sensors 96, 98, 102, 104, provides/inputs the data to the controller 80 (along with other possible non-sensor related inputs), and controls operation of the synthetic jet(s) 62 to provide controlled convection cooling to the device 92 to minimize power consumption.

Beneficially, embodiments of the invention thus provide a cooling system, and control scheme for operation thereof, that provides enhanced convection cooling to temperature-dependent power producing electrical devices and/or temperature-dependent power consuming electrical devices. The cooling system is operated via the control scheme to selectively vary the amount of convection cooling provided by the cooling system during changing operating conditions of the temperature-dependent power producing/power consuming electrical devices in order to maximize the power output of power producing electrical devices or to minimize the power consumption of power consuming electrical devices. This has implications for not only improved performance, but reduced thermal degradation and improved reliability. The synthetic jets in the cooling system provide convection cooling in an efficient matter, with the cooling system consuming small amounts of power and being resistive to failure, so as to provide inexpensive and reliable cooling.

A technical contribution for the disclosed method and apparatus is that it provides for a controller implemented technique for maximizing the net system power output of temperature-dependent power producing electrical devices and/or for minimizing the total system power consumption of temperature-dependent power consuming electrical devices.

Therefore, according to one embodiment of the invention, a cooling system includes a low power active cooling device and a controller electrically coupled to the active cooling device, the controller configured to generate and transmit a drive signal to the active cooling device to selectively activate the active cooling device. The cooling system also includes a plurality of sensors configured to measure power consumption of the active cooling device and to measure one or more operational parameters associated with operation of a heat producing electrical device being cooled by the active cooling device, the heat producing electrical device comprising one of a temperature-dependent power producing device and a temperature-dependent power consuming device. The controller of the cooling system is configured to receive an input from the plurality of sensors of the power consumption of the active cooling device and of the one or more measured operational parameters, the input including a device output power if the heat producing electrical device is a power producing device or a device input power if the heat producing electrical device is a power consuming device. The controller of the cooling system is further configured to generate and transmit a drive signal to the active cooling device based on the received input of the power consumption of the active cooling device and of the measured operational parameters in order to cause the active cooling device to selectively cool the heat producing electrical device. In generating and transmitting the drive signal to the active cooling device, the controller controls an amount of convection cooling provided by the active cooling device in order to maximize a net system power output if the device is a power producing device or minimize a total system power input if the device is a power consuming device, with the maximizing of the net system power output comprising maximizing a net power defined by the power generated by the power producing device minus the power consumed by the active cooling device and with the minimizing of the total system power input comprising minimizing a total power defined by the power consumed by the power consuming device plus the power consumed by the active cooling device.

According to another embodiment of the invention, a method of cooling a temperature-dependent power producing device includes providing an active cooling device configured to generate a cooling fluid flow that provides convection cooling for a power producing device, the power producing device comprising a temperature-dependent power producing device where a level of power generated therefrom is dependent in part on an operating temperature of the device. The method also includes operatively connecting a controller to the active cooling device that is configured to control a supply of power provided to the active cooling device in order to selectively provide the convection cooling for the device and providing at least one of a current measurement and a voltage measurement of the output power generated by the power producing device to the controller, the at least one of the current measurement and the voltage measurement of the output power being measured by one or more sensors. The method further includes providing a measurement of power consumed by the active cooling device in cooling the power producing device to the controller and controlling, via the controller, the supply of power provided to the active cooling device based on the measurement of power provided to the active cooling device and based on the at least one of the current measurement and the voltage measurement provided to the controller. In the controlling of the supply of power provided to the active cooling device, the controller controls an amount of convection cooling provided by the active cooling device in order to cause the power producing device to be operated at a temperature at which a net system power is maximized, the net system power being defined as the power generated by the power producing device minus the power consumed by the active cooling device.

According to yet another embodiment of the invention, a method of cooling a temperature-dependent power consuming device includes providing a low power active cooling device configured to generate a cooling fluid flow that provides convection cooling for a power consuming device, the power consuming device comprising a temperature-dependent power consuming device where a level of power consumed thereby is dependent in part on an operating temperature of the device. The method also includes operatively connecting a controller to the active cooling device that is configured to control a supply of power provided to the active cooling device in order to control generation of the cooling jet so as to selectively provide the convection cooling for the device and providing to the controller at least one of a current measurement and a voltage measurement of the input power provided to the power consuming device responsive to a power demand thereby, the at least one of the current measurement and the voltage measurement of the input power being measured by one or more sensors. The method further includes providing to the controller a measurement of power consumed by the active cooling device in cooling the power consuming device and controlling, via the controller, the supply of power provided to the active cooling device based on the measurement of power provided to the active cooling device and based on the at least one of the current measurement and the voltage measurement provided to the controller. In the controlling of the supply of power provided to the active cooling device, the controller controls an amount of convection cooling provided by the active cooling device in order to cause the power consuming device to be operated at a temperature at which a total system power is minimized, the total system power being defined as the power consumed by the power consuming device plus the power consumed by the active cooling device.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A cooling system comprising:
 a low power active cooling device;
 a controller electrically coupled to the active cooling device, the controller configured to generate and transmit a drive signal to the active cooling device to selectively activate the active cooling device; and
 a plurality of sensors configured to measure power consumption of the active cooling device and to measure one or more operational parameters associated with operation of a heat producing electrical device being cooled by the active cooling device, the heat producing electrical device comprising one of a temperature-dependent power producing device and a temperature-dependent power consuming device;
 wherein the controller is further configured to:
  receive an input from the plurality of sensors of the power consumption of the active cooling device and of the one or more measured operational parameters, the input including a device output power if the heat producing electrical device is a power producing device or a device input power if the heat producing electrical device is a power consuming device; and
  generate and transmit a drive signal to the active cooling device based on the received input of the power consumption of the active cooling device and of the measured operational parameters in order to cause the active cooling device to selectively cool the heat producing electrical device;
 wherein, in generating and transmitting the drive signal to the active cooling device, the controller controls an amount of convection cooling provided by the active cooling device in order to maximize a net system power output if the device is a power producing device or minimize a total system power input if the device is a power consuming device, with the maximizing of the net system power output comprising maximizing a net power defined by the power generated by the power producing device minus the power consumed by the active cooling device and with the minimizing of the total system power input comprising minimizing a total power defined by the power consumed by the power consuming device plus the power consumed by the active cooling device.

2. The cooling system of claim 1 wherein the low power active cooling device comprises a synthetic jet including:
 a body enclosing a chamber, the body having an orifice formed therein; and
 an actuator element coupled to a surface of the body to selectively cause displacement of the surface.

3. The cooling system of claim 2 wherein the synthetic jet comprises a dual cool jet including:
 a first actuator element coupled to a first surface of the body to selectively cause displacement of the first surface; and
 a second actuator element coupled to a second surface of the body to selectively cause displacement of the second surface, the second surface being arranged parallel to the first surface;
 wherein the controller is configured to generate and transmit a drive signal to the dual cool jet that causes the first and second actuator elements to selectively cause displacement of the first and second surfaces so as to selectively generate a series of fluid vortices that are projected out from the orifice of the body.

4. The cooling system of claim 1 wherein the controller is further configured to:
 receive a plurality of inputs from the plurality of sensors of the device output power or the device input power via a feedback loop; and
 iteratively adjust the drive signal generated and transmitted to the active cooling device based on the plurality of inputs, so as to iteratively adjust the amount of convection cooling provided by the active cooling device to the heat producing electrical device and so as to cause the heat producing electrical device to operate at the temperature at which the net system power output is maximized if the device is a power producing device or the total system power input is minimized if the device is a power consuming device.

5. The cooling system of claim 1 wherein the input further comprises at least one of an operating temperature of the heat producing electrical device and an ambient temperature in which the heat producing electrical device is operating.

6. The cooling system of claim 1 wherein the controller comprises one of:
a single input-single output (SISO) controller or a proportional integral differential (PID) controller configured to generate and transmit a drive signal to the active cooling device based on the input thereto of a single measured operational parameter, the single measured operational parameter being the net system output power if the heat producing electrical device is a power producing device or the total system input power if the heat producing electrical device is a power consuming device; or
a multiple input-single output (MISO) controller configured to generate and transmit a drive signal to the active cooling device based on the input thereto of a plurality of measured operational parameters.

7. The cooling system of claim 1 wherein, when the heat producing electrical device is a power producing device, the device comprises one of a photovoltaic (PV) module, a battery, a power inverter, or power electronics.

8. The cooling system of claim 1 wherein, when the heat producing electrical device is a power consuming device, the device comprises one of a semiconductor device, an integrated circuit, a central processing unit (CPU), a graphics processing unit (GPUs), a light emitting diode (LED), or a telecom device.

9. A method of cooling a temperature-dependent power producing device comprising:
providing an active cooling device configured to generate a cooling fluid flow that provides convection cooling for a power producing device, the power producing device comprising a temperature-dependent power producing device where a level of power generated therefrom is dependent in part on an operating temperature of the device;
operatively connecting a controller to the active cooling device, the controller configured to control a supply of power provided to the active cooling device in order to selectively provide the convection cooling for the device;
providing at least one of a current measurement and a voltage measurement of the output power generated by the power producing device to the controller, the at least one of the current measurement and the voltage measurement of the output power being measured by one or more sensors;
providing a measurement of power consumed by the active cooling device in cooling the power producing device to the controller; and
controlling, via the controller, the supply of power provided to the active cooling device based on the measurement of power provided to the active cooling device and based on the at least one of the current measurement and the voltage measurement provided to the controller;
wherein, in the controlling of the supply of power provided to the active cooling device, the controller controls an amount of convection cooling provided by the active cooling device in order to cause the power producing device to be operated at a temperature at which a net system power is maximized, the net system power being defined as the power generated by the power producing device minus the power consumed by the active cooling device.

10. The method of claim 9 further comprising:
providing a plurality of measurements of the output power generated by the power producing device and of the power consumed by the active cooling device to the controller via a feedback loop; and
iteratively adjusting, via the controller, the supply of power provided to the active cooling device based thereon, so as to iteratively adjust the amount of convection cooling provided by the active cooling device to the power producing device.

11. The method of claim 9 wherein the controller comprises one of a single input-single output (SISO) controller and a proportional integral differential (PID) controller.

12. The method of claim 9 further comprising providing at least one additional operational parameter to the controller measured via one or more additional sensors, the at least one additional operational parameter comprising a parameter within which the power producing device is operating or an operational parameter that affects operation of the power producing device.

13. The method of claim 12 wherein the at least one additional input parameter comprises one or more of an operating temperature of the power producing device and an ambient temperature in which the power producing device is operating.

14. The method of claim 12 wherein the controller comprises a multiple input-single output (MISO) controller configured to determine the supply of power provided to the active cooling device based on the measurement of the output power generated by the power producing device, the measurement of the power consumed by the active cooling device, and the at least one additional operational parameter.

15. The method of claim 9 wherein the at least one of the current measurement and the voltage measurement of the output power is measured by the one or more sensors after providing a fraction of the output power to the active cooling device and the controller.

16. A method of cooling a temperature-dependent power consuming device comprising:
providing a low power active cooling device configured to generate a cooling fluid flow that provides convection cooling for a power consuming device, the power consuming device comprising a temperature-dependent power consuming device where a level of power consumed thereby is dependent in part on an operating temperature of the device;
operatively connecting a controller to the active cooling device, the controller configured to control a supply of power provided to the active cooling device in order to control generation of the cooling jet so as to selectively provide the convection cooling for the device;
providing to the controller at least one of a current measurement and a voltage measurement of the input power provided to the power consuming device responsive to a power demand thereby, the at least one of the current measurement and the voltage measurement of the input power being measured by one or more sensors;
providing to the controller a measurement of power consumed by the active cooling device in cooling the power consuming device; and controlling, via the controller, the supply of power provided to the active cooling device based on the measurement of power provided to the active cooling device and based on the at least one of the current measurement and the voltage measurement provided to the controller;

wherein, in the controlling of the supply of power provided to the active cooling device, the controller controls an amount of convection cooling provided by the active cooling device in order to cause the power consuming device to be operated at a temperature at which a total system power is minimized, the total system power being defined as the power consumed by the power consuming device plus the power consumed by the active cooling device.

17. The method of claim 16 further comprising:

providing a plurality of measurements of the input power provided to the power consuming device and of the power consumed by the active cooling device to the controller via a feedback loop; and iteratively adjusting, via the controller, the supply of power provided to the active cooling device based thereon, so as to iteratively adjust the amount of convection cooling provided by the active cooling device to the power consuming device.

18. The method of claim 16 further comprising providing at least one additional operational parameter to the controller measured via one or more additional sensors, the at least one additional operational parameter comprising a parameter within which the power consuming device is operating or an operational parameter that affects operation of the power consuming device.

19. The method of claim 18 wherein the at least one additional input parameter comprises one or more of an operating temperature of the power consuming device and an ambient temperature in which the power consuming device is operating.

20. The method of claim 18 wherein the controller comprises a multiple input-single output (MISO) controller configured to determine the supply of power provided to the active cooling device based on the measurement of the input power provided to the power consuming device, the measurement of the power consumed by the active cooling device, and the at least one additional operational parameter.

* * * * *